(12) United States Patent
Luo et al.

(10) Patent No.: US 11,797,204 B2
(45) Date of Patent: Oct. 24, 2023

(54) DATA COMPRESSION PROCESSING METHOD AND APPARATUS, AND COMPUTER-READABLE STORAGE MEDIUM

(71) Applicant: Huawei Technologies Co., Ltd., Shenzhen (CN)

(72) Inventors: Siwei Luo, Chengdu (CN); Dong Qiu, Shenzhen (CN); Rui Qian, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 68 days.

(21) Appl. No.: 17/464,904

(22) Filed: Sep. 2, 2021

(65) Prior Publication Data
US 2021/0397350 A1   Dec. 23, 2021

Related U.S. Application Data

(63) Continuation of application No. PCT/CN2020/088785, filed on May 6, 2020.

(30) Foreign Application Priority Data

Jun. 17, 2019   (CN) .......................... 201910521554.9

(51) Int. Cl.
*G06F 3/06* (2006.01)
*H03M 7/30* (2006.01)

(52) U.S. Cl.
CPC ............ *G06F 3/064* (2013.01); *G06F 3/0608* (2013.01); *G06F 3/0673* (2013.01); *H03M 7/30* (2013.01); *G06F 3/0685* (2013.01)

(58) Field of Classification Search
CPC ...... G06F 3/064; G06F 3/0608; G06F 3/0673; G06F 3/0685; G06F 3/0683;
(Continued)

(56) References Cited

U.S. PATENT DOCUMENTS 6,208,999 B1 *   3/2001   Spilo .................... G06F 11/1435
6,348,881 B1 *   2/2002   Buer .................... H03M 7/3084
                                                                       375/240
(Continued)

FOREIGN PATENT DOCUMENTS

CN         101963982 A      2/2011
CN         102156751 A      8/2011
(Continued)

OTHER PUBLICATIONS

Ali Seyed Shirkhorshidi et al., "C Comparison Study on Similarity and Dissimilarity Measures in Clustering Data", Dec. 11, 2015, pp. 1-13, https://journals.plos.org/plosone/article?id=10.1371/journal.pone.0144059 (Year: 2015).*

(Continued)

*Primary Examiner* — Christopher D Birkhimer
(74) *Attorney, Agent, or Firm* — HUAWEI TECHNOLOGIES CO., LTD.

(57) ABSTRACT

A data processing method includes obtaining a plurality of data blocks, determining a first data block and a second data block from the data blocks, where the first data block has a first hash value, and the second data block has a second hash value, where the first hash value is obtained by performing calculation on the first data block based on a hash algorithm and the second hash value is obtained by performing calculation on the second data block based on the hash algorithm, and combining and compressing the first data block and the second data block based on a degree of similarity of the first data block and the second data block.

20 Claims, 11 Drawing Sheets

(58) Field of Classification Search
CPC ..... G06F 3/0671; H03M 7/30; H03M 7/3084; H03M 7/4031
See application file for complete search history.

(56) References Cited

U.S. PATENT DOCUMENTS

| | | | |
|---|---|---|---|
| 7,079,051 B2* | 7/2006 | Storer | H03M 7/30 341/51 |
| 7,542,593 B1* | 6/2009 | Chaurasia | G06V 40/37 382/119 |
| 7,562,012 B1* | 7/2009 | Wold | G10H 1/0041 704/200 |
| 8,732,403 B1* | 5/2014 | Nayak | G06F 3/0619 711/170 |
| 8,983,941 B1* | 3/2015 | Murphy-Chutorian | G06F 16/583 707/723 |
| 9,385,749 B1* | 7/2016 | Nam | H03M 7/607 |
| 9,454,321 B1* | 9/2016 | Smaldone | G06F 3/061 |
| 9,715,434 B1* | 7/2017 | Xu | G06F 3/067 |
| 9,880,762 B1* | 1/2018 | Armangau | G06F 3/067 |
| 10,013,200 B1* | 7/2018 | Shveidel | G06F 3/0613 |
| 10,097,202 B1* | 10/2018 | Ki | G11B 20/00007 |
| 10,108,543 B1* | 10/2018 | Duggal | G06F 3/0619 |
| 10,108,544 B1* | 10/2018 | Duggal | G06F 16/1748 |
| 10,153,779 B1* | 12/2018 | Bordignon | H03M 7/24 |
| 10,298,258 B1* | 5/2019 | Tsao | H03M 7/30 |
| 10,795,812 B1* | 10/2020 | Duggal | G06F 3/067 |
| 2002/0178410 A1* | 11/2002 | Haitsma | H04N 19/467 714/709 |
| 2006/0095521 A1* | 5/2006 | Patinkin | G06Q 10/107 709/206 |
| 2006/0184963 A1* | 8/2006 | Snijder | H04N 7/163 707/E17.028 |
| 2008/0144079 A1* | 6/2008 | Pandey | H03M 7/30 358/1.15 |
| 2008/0183693 A1* | 7/2008 | Arasu | G06F 16/2456 707/999.005 |
| 2010/0077013 A1* | 3/2010 | Clements | G06F 16/1748 707/822 |
| 2010/0088296 A1* | 4/2010 | Periyagaram | G06F 16/183 707/E17.014 |
| 2010/0106713 A1* | 4/2010 | Esuli | G06K 9/6276 707/E17.014 |
| 2010/0125553 A1* | 5/2010 | Huang | G06F 11/1453 707/661 |
| 2010/0174879 A1* | 7/2010 | Pawar | G06F 3/0608 711/170 |
| 2010/0174881 A1* | 7/2010 | Anglin | G06F 11/1453 711/E12.103 |
| 2010/0281081 A1* | 11/2010 | Stager | G06F 9/5022 707/814 |
| 2010/0333116 A1* | 12/2010 | Prahlad | G06F 16/1844 713/153 |
| 2011/0320915 A1* | 12/2011 | Khan | G06F 11/1048 714/763 |
| 2012/0076422 A1* | 3/2012 | Yang | G06F 16/5838 382/201 |
| 2012/0137061 A1 | 5/2012 | Yang et al. | |
| 2012/0257116 A1* | 10/2012 | Hendrickson | G06F 16/70 348/700 |
| 2013/0024434 A1 | 1/2013 | Douglas et al. | |
| 2013/0166861 A1* | 6/2013 | Takano | G06F 3/064 711/161 |
| 2013/0275440 A1* | 10/2013 | Amer-Yahia | G06F 16/35 707/E17.084 |
| 2014/0143517 A1* | 5/2014 | Jin | G06F 3/067 711/171 |
| 2015/0046492 A1* | 2/2015 | Balachandran | G06F 8/36 707/772 |
| 2015/0063627 A1* | 3/2015 | Mohammad | G06T 7/0004 382/103 |
| 2015/0127342 A1* | 5/2015 | Sharifi | G10L 17/18 704/239 |
| 2015/0205816 A1* | 7/2015 | Periyagaram | G06F 11/1453 707/827 |
| 2015/0261776 A1* | 9/2015 | Attarde | G06F 16/1748 707/664 |
| 2016/0306561 A1* | 10/2016 | Huang | G06F 3/0679 |
| 2016/0350324 A1* | 12/2016 | Wang | G06F 16/137 |
| 2017/0038978 A1* | 2/2017 | Li | G06F 3/0611 |
| 2017/0185665 A1* | 6/2017 | Gong | G06N 20/00 |
| 2017/0212698 A1* | 7/2017 | Bhadauria | G06F 12/0888 |
| 2018/0095674 A1* | 4/2018 | Alameldeen | G06F 3/064 |
| 2018/0138921 A1* | 5/2018 | Arelakis | H03M 7/30 |
| 2018/0260643 A1* | 9/2018 | Sheikh Faridul | G06T 7/251 |
| 2018/0314727 A1* | 11/2018 | Epstein | G06N 5/003 |
| 2019/0012164 A1* | 1/2019 | Geng | H04L 69/04 |
| 2019/0034475 A1* | 1/2019 | Parikh | G06F 16/2255 |
| 2019/0095463 A1* | 3/2019 | Moussafi | H04N 1/00198 |
| 2019/0132002 A1* | 5/2019 | Pennala | H03M 7/3066 |
| 2019/0171624 A1 | 6/2019 | Douglis et al. | |
| 2019/0294589 A1 | 9/2019 | Moiseev et al. | |
| 2019/0379394 A1* | 12/2019 | Hallak | G06F 16/1744 |
| 2020/0310686 A1* | 10/2020 | Truong | G06F 3/061 |
| 2021/0374021 A1* | 12/2021 | Santhakumar | G06F 11/3485 |

FOREIGN PATENT DOCUMENTS

| | | |
|---|---|---|
| CN | 102708183 A | 10/2012 |
| CN | 102722450 A | 10/2012 |
| CN | 103384884 A | 11/2013 |
| CN | 105022741 A | 11/2015 |
| CN | 105204781 A | 12/2015 |
| CN | 107229420 A | 10/2017 |
| CN | 107679073 A | 2/2018 |
| CN | 107682016 A | 2/2018 |
| CN | 109716658 A | 5/2019 |
| CN | 109716660 A | 5/2019 |
| CN | 109756536 A | 5/2019 |

OTHER PUBLICATIONS

Anonymous, "File Storage Hardware and Disk Organization", Jan. 13, 2012, pp. 1-3, https://web.archive.org/web/20120113045434/http://ntfs.com/hard-disk-basics.htm#Sectors%20and%20Clusters (Year: 2012).*

* cited by examiner

LSH Tree 2

LSH Tree 3

LSH Tree 6

LSH Tree 7

DATA COMPRESSION PROCESSING METHOD AND APPARATUS, AND COMPUTER-READABLE STORAGE MEDIUM

CROSS-REFERENCE TO RELATED APPLICATIONS

This is a continuation of International Patent Application No. PCT/CN2020/088785 filed on May 6, 2020, which claims priority to Chinese Patent Application No. 201910521554.9 filed on Jun. 17, 2019. The disclosures of the aforementioned applications are hereby incorporated by reference in their entireties.

TECHNICAL FIELD

This application relates to the field of computer technologies, and in particular, to a data processing method and apparatus, and a computer-readable storage medium.

BACKGROUND

Data compression is a method for reducing redundant data in data to reduce data storage space without losing useful information. Through data compression, storage space can be effectively saved.

Combination compression is a common compression manner, and means that a plurality of data blocks is first combined into one long data block, and then the combined data block is compressed.

Generally, a larger quantity of combined and compressed data blocks leads to a higher data reduction ratio. However, as a quantity of combined and compressed data blocks increases, data compression and decompression overheads increase, and data read/write performance decreases. Therefore, how to select data blocks for combination and compression to achieve a balance between a data reduction ratio and system overheads is an urgent problem to be resolved.

SUMMARY

Embodiments of this application provide a data processing method and apparatus, and a computer-readable storage medium, to achieve a balance between a data reduction ratio of a storage system and system overheads.

According to a first aspect, an embodiment of this application provides a data processing method, including obtaining a plurality of data blocks, determining at least a first data block and a second data block from the plurality of data blocks, where the first data block has a first hash value, the second data block has a second hash value, the first hash value is obtained by performing calculation on the first data block based on a hash algorithm, the second hash value is obtained by performing calculation on the second data block based on the hash algorithm, and a difference between the first hash value and the second hash value is less than a similarity threshold, and combining and compressing the first data block and the second data block.

In this implementation, after the plurality of data blocks are obtained, a similarity between the data blocks is indirectly evaluated by comparing differences between hash values of the data blocks, and further, data blocks that meet a similarity condition are determined from the data blocks and are combined and compressed. In this way, a relatively good data reduction ratio can be obtained for all combined and compressed data blocks, and a balance between a data reduction ratio of a storage system and system overheads can be better achieved.

To improve solution flexibility, in this embodiment of this application, the hash algorithm may have a plurality of implementations provided that a hash algorithm meets a rule that corresponding data blocks are more similar when hash values are closer to each other. For example, in a possible implementation, the hash algorithm may be a locality-sensitive hash algorithm.

Further, when the hash algorithm is the locality-sensitive hash algorithm, a specific implementation of performing calculation on the first data block based on the hash algorithm may include segmenting the first data block into a plurality of data sub-blocks of different lengths, calculating a hash value of each of the plurality of data sub-blocks of different lengths, and performing combination calculation on hash values of the plurality of data sub-blocks of different lengths, to obtain a locality-sensitive hash value corresponding to the first data block, and using the locality-sensitive hash value as the first hash value.

In this implementation, during calculation of the locality-sensitive hash value, the data block may be segmented into a finer granularity by using a variable-length block segmentation technology, to obtain the plurality of data sub-blocks of different lengths, to avoid a problem that data cannot be deduplicated due to boundary movement of the data block.

To improve solution flexibility, in this embodiment of this application, a difference between any two locality-sensitive hash values may be calculated in a plurality of implementations. For example, a Jaccard distance, a Euclidean distance, a Hamming distance, or the like of different locality-sensitive hash values is calculated. This is not limited in this embodiment of this application.

When different difference calculation manners are used, corresponding similarity thresholds may be different. For example, when the difference calculation manner is the Jaccard distance, a Jaccard distance between the first hash value and the second hash value is less than a first distance threshold. For another example, when the difference calculation manner is the Euclidean distance, a Euclidean distance between the first hash value and the second hash value is less than a second distance threshold. For still another example, when the difference calculation manner is the Hamming distance, a Hamming distance between the first hash value and the second hash value is less than a third distance threshold. When the foregoing three implementations are used to calculate the difference between any two locality-sensitive hash values, calculation accuracy can be better ensured, and further, solution reliability is ensured.

In a possible implementation, combining and compressing the first data block and the second data block includes combining the first data block and the second data block, and compressing a combined data block to obtain a target data block.

In a possible implementation, after the first data block and the second data block are combined and compressed, a combination compression identifier may be added to metadata of the first data block or the second data block. For example, a first combination compression identifier is added to metadata information corresponding to the first data block, to indicate that a compression manner of the first data block is combination compression. For example, a second combination compression identifier is added to metadata information corresponding to the second data block, to indicate that a compression manner of the second data block is combination compression. In this way, when the combined and compressed data block is read, it may be quickly determined, based on a combination and compression identifier in metadata, that a decompression method corresponding to combination compression is used to decompress the read combined and compressed data block, thereby improving data reading efficiency.

In a possible implementation, after the first data block and the second data block are combined and compressed, a location identifier may be added to metadata of the first data block or the second data block. For example, a first location identifier is added to metadata information corresponding to the first data block, to indicate a location of the first data block in the target data block. For example, a second location identifier is added to metadata information corresponding to the second data block, to indicate a location of the second data block in the target data block. In this way, after the combined and compressed data block is decompressed, a location of each data block in the combined and compressed data block may be determined based on a location identifier corresponding to each data block (for example, it is determined based on the first location identifier that the first data block is a first combined and compressed data block), so that data reading efficiency is further improved.

In a possible implementation, before the first data block and the second data block are combined and compressed, a step of determining whether a data reduction ratio corresponding to the target data block obtained after the first data block and the second data block are combined and compressed reaches a reduction ratio threshold may be further performed. The first data block and the second data block are combined and compressed only when determining that the data reduction ratio corresponding to the target data block reaches the reduction ratio threshold. If the data reduction ratio corresponding to the target data block cannot reach the reduction ratio threshold, combination and compression of the first data block and the second data block may be abandoned, and the first data block and the second data block are separately compressed by using a common compression algorithm. In this way, it can be better ensured that a relatively high data reduction ratio can be obtained for all data blocks that are used in combination compression.

According to a second aspect, an embodiment of this application provides a data processing apparatus, including a communications interface and a processor. The processor is configured to obtain a plurality of data blocks by using the communications interface, determine at least a first data block and a second data block from the plurality of data blocks, where the first data block has a first hash value, the second data block has a second hash value, the first hash value is obtained by performing calculation on the first data block based on a hash algorithm, the second hash value is obtained by performing calculation on the second data block based on the hash algorithm, and a difference between the first hash value and the second hash value is less than a similarity threshold, and combine and compress the first data block and the second data block. This embodiment provides the data processing apparatus that is configured to compress data, to obtain a relatively good data reduction ratio for all combined and compressed data blocks, and to achieve a better balance between a data reduction ratio of a storage system and system overheads.

To improve solution flexibility, in this embodiment of this application, the hash algorithm may have a plurality of implementations provided that a hash algorithm meets a rule that corresponding data blocks are more similar when hash values are closer to each other. For example, in a possible implementation, the hash algorithm may be a locality-sensitive hash algorithm.

In a possible implementation, when performing calculation on the first data block based on the hash algorithm, the processor may segment the first data block into a plurality of data sub-blocks of different lengths, calculate a hash value of each of the plurality of data sub-blocks of different lengths, and combine and calculate hash values of the plurality of data sub-blocks of different lengths, to obtain a locality-sensitive hash value corresponding to the first data block, and use the locality-sensitive hash value as the first hash value.

In this embodiment of this application, the processor may calculate a difference between any two locality-sensitive hash values in a plurality of implementations. When different difference calculation manners are used, corresponding similarity thresholds may be different. For example, when the processor calculates the difference between any two locality-sensitive hash values by using a Jaccard distance, a Jaccard distance between the first hash value and the second hash value is less than a first distance threshold. For another example, when the processor calculates the difference between any two locality-sensitive hash values by using a Euclidean distance, a Euclidean distance between the first hash value and the second hash value is less than a second distance threshold. For still another example, when the processor calculates the difference between any two locality-sensitive hash values by using a Hamming distance, a Hamming distance between the first hash value and the second hash value is less than a third distance threshold.

In a possible implementation, when combining and compressing the first data block and the second data block, the processor may combine the first data block and the second data block, and then compress a combined data block to obtain a target data block.

Further, after the processor combines and compresses the first data block and the second data block, the processor may further add a first combination compression identifier to metadata information corresponding to the first data block, to indicate that a compression manner of the first data block is combination compression, and may further add a second combination compression identifier to metadata information corresponding to the second data block, to indicate that a compression manner of the second data block is combination compression.

Further, after the processor combines and compresses the first data block and the second data block, the processor may further add a first location identifier to the metadata information corresponding to the first data block, to indicate a location of the first data block in the target data block, and may further add a second location identifier to the metadata information corresponding to the second data block, to indicate a location of the second data block in the target data block.

In addition, before combining and compressing the first data block and the second data block, the processor may further determine that a data reduction ratio corresponding to the target data block obtained after the first data block and the second data block are combined and compressed reaches a reduction ratio threshold. In other words, the processor may combine and compress the first data block and the second data block only when determining that the data reduction ratio corresponding to the target data block reaches the reduction ratio threshold. This can better ensure that a relatively high data reduction ratio can be obtained for all data blocks that are used in combination compression.

According to a third aspect, an embodiment of this application provides a computer-readable storage medium, and a computer program is stored on the computer-readable storage medium. When the program is executed by a processor, the method described in any one of the first aspect of this application or the possible implementations of the first aspect can be implemented.

According to a fourth aspect, an embodiment of this application further provides a computer program product. When the program product is executed by a computer, the computer may be enabled to perform the method described in any one of the first aspect of this application or the possible implementations of the first aspect.

According to a fifth aspect, an embodiment of this application further provides a chip, and the chip is coupled to a memory and is configured to invoke and execute a computer program stored in the memory, to perform the method described in any one of the first aspect of this application or the possible implementations of the first aspect.

DESCRIPTION OF EMBODIMENTS

To make objectives, technical solutions, and advantages of embodiments of this application clearer, the following describes the technical solutions in the embodiments of this application in detail with reference to the accompanying drawings and specific implementations.

In a big data era, a volume of data stored in a storage system increases explosively. Because storage space in the storage system is limited, to ensure storage performance of the storage system, redundant data in the data may be reduced by using a compression technology, to save data storage space. There are mainly the following three solutions for compressing a data block.

Type 1: Separate compression.

To be specific, each data block is separately compressed, and each data block corresponds to one compressed data block. Generally, a data reduction ratio effect achieved through separate compression depends on a compression algorithm used during compression. A better data reduction ratio effect than that in a common compression (such as Lempel-Ziv (LZ) coding) algorithm can be achieved by using a deeper compression algorithm (such as Zstandard, Huffman coding, or arithmetic coding) for the data block. However, compared with the common compression algorithm, if the deeper compression algorithm is used, problems such as increased central processing unit (CPU) overheads, an increased compression and decompression delay, and reduced foreground input/output (IO) reading performance are caused. In a backup archiving application scenario in which a data reduction ratio is mainly considered, a user is insensitive to CPU overheads and an IO delay, and a user requirement may be met by improving a depth of a compression algorithm. However, for a performance-sensitive scenario such as a database, finance, and big data analysis, improving the data reduction ratio by reducing performance cannot be tolerated by a customer, and performance of a key service is negatively affected. Therefore, when only the depth of the compression algorithm is adjusted, only data reduction ratio problems of some scenarios can be resolved, and a majority of scenarios cannot be covered.

Type 2: Combination compression.

Because a data length of an input data block is not limited in a compression algorithm, a plurality of fixed-length data blocks may be combined into one long data block and then compressed. In this compression solution, a data reduction ratio can be improved without changing the algorithm.

Figure 1:
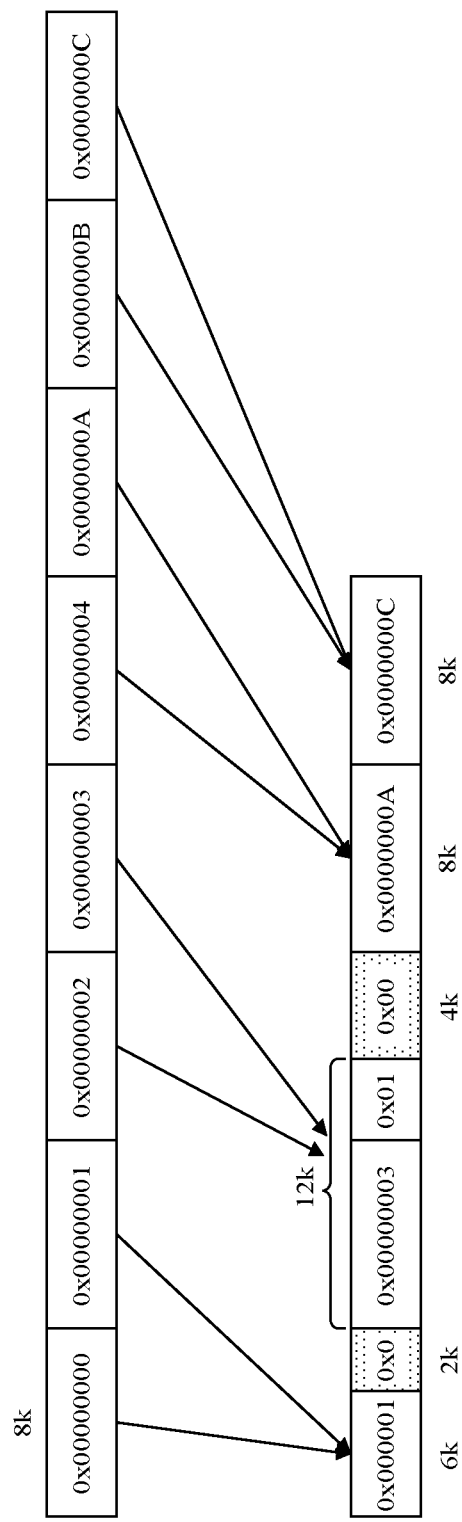
FIG. 1 is a schematic diagram of a combination compression solution according to an embodiment of this application.

For example, as shown in FIG. 1, it is assumed that there are eight data blocks, and a data length of each data block is 8 k. For example, a quantity of combined data blocks is 2. Data lengths obtained after different data blocks are combined and compressed may be different. For example, in FIG. 1, from left to right, a length of a data block obtained after a first data block and a second data block are combined and compressed is 6 k, a length of a data block obtained after a third data block and a fourth data block are combined and compressed is 12 k, a length of a data block obtained after a fifth data block and a sixth data block are combined and compressed is 8 k, and a length of a data block obtained after a seventh data block and an eighth data block are combined and compressed is 8 k. Certainly, the foregoing is merely an example. In a specific implementation process, more data blocks may be combined and compressed. This is not limited in this embodiment of this application.

In a combination compression solution, a data reduction ratio effect increases as a quantity of combined and compressed data blocks increases. However, as the quantity of combined and compressed data blocks increases, data compression and decompression overheads increase, and data read/write performance decreases.

Type 3: Incremental (Delta) compression.

Figure 2:
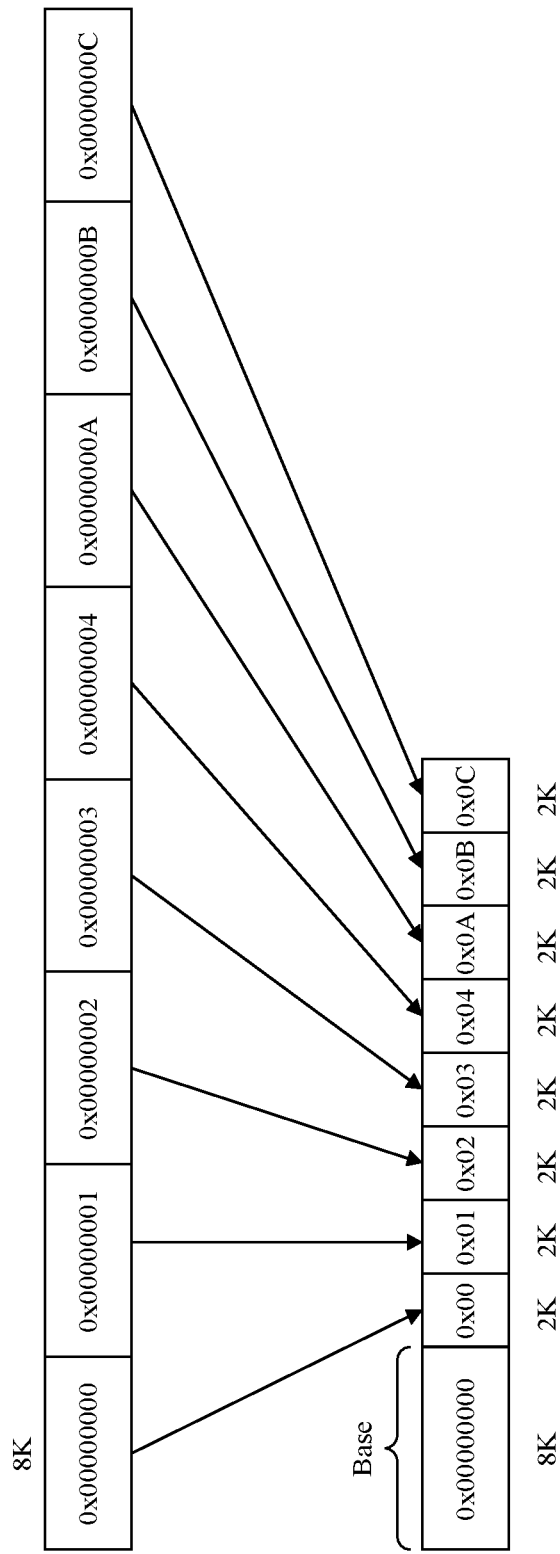
FIG. 2 is a schematic diagram of a Delta compression solution according to an embodiment of this application.

Same parts of a plurality of data blocks are extracted as a base data block, and different parts are appended to the base data block in an incremental (Delta) form. An original data block may be reversely restored in a base+delta storage manner. In this way, only one (namely, the base data block) of the same parts of the plurality of data blocks needs to be stored, thereby improving a data reduction ratio effect. For example, as shown in FIG. 2, it is assumed that there are eight data blocks, a data length of each data block is 8 k, and a length of a data block obtained after delta compression is 24 k.

In a delta compression solution, a same block in the plurality of data blocks needs to be found as a base block. However, in actual application, a scenario that meets this condition is not common, and this solution has dependency on a dataset feature. If there are a relatively small quantity of base blocks that meet the condition, a data reduction ratio improvement effect is limited compared with a conventional separate compression solution. In addition, after a data stream that is newly written to a system is segmented into data blocks, the data blocks need to be compared with all existing base blocks in the system and it is determined whether a delta compression condition is met, thereby increasing CPU calculation and determining overheads of the system.

It can be learned from the foregoing compression solution analysis that, to pursue a high data reduction ratio, relatively large system performance overheads need to be sacrificed, and to save system overheads and improve data read/write performance, it is difficult to improve the data reduction ratio. In view of this, in this embodiment of this application, during data compression, a balance between a data reduction ratio of a storage system and system overheads is flexibly adjusted. In this method, after a plurality of data blocks that need to be compressed are obtained, a similarity between the data blocks is indirectly evaluated by using hash values of the data blocks, and data blocks that meet a similarity condition are determined from the data blocks. For example, a first data block and a second data block are determined (the first data block has a first hash value, the second data block has a second hash value, the first hash value is obtained by performing calculation on the first data block based on a hash algorithm, the second hash value is obtained by performing calculation on the second data block based on the hash algorithm, and a difference between the first hash value and the second hash value is less than a similarity threshold). Then, the determined data blocks are combined and compressed. Therefore, a relatively good data reduction ratio can be obtained for all combined and compressed data blocks, and a common compression manner is used for another data block, to reduce system overheads. A technical effect that the storage system flexibly adjusts, based on the similarity between the data blocks, a quantity of combined and compressed data blocks can be implemented, thereby implementing the balance between the data reduction ratio of the storage system and the system overheads.

The technical solutions in the embodiments of this application may be applied to a plurality of storage systems, such as a storage system in a single computer, a distributed storage system or a centralized storage system that includes a plurality of computers. This is not limited in the embodiments of this application.

Figure 3A:
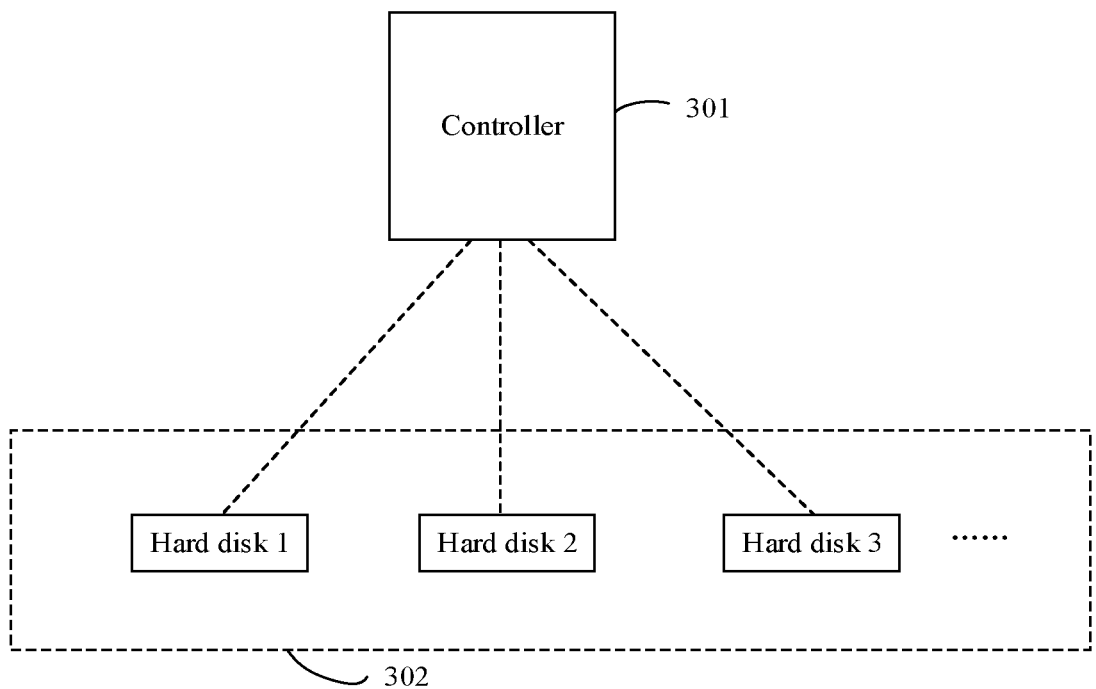
FIG. 3A is a schematic structural diagram of a storage system applicable to an embodiment of this application.

FIG. 3A shows a storage system applicable to an embodiment of this application. As shown in FIG. 3A, the storage system includes a controller 301 and at least one hard disk 302 configured to store data. FIG. 3A shows three hard disks: a hard disk 1, a hard disk 2, and a hard disk 3. In actual application, a quantity of hard disks in the storage system may be less than three or more than three. This is not limited in this embodiment of this application. The hard disk 302 may be a solid-state disk (SSD), a disk, a hybrid hard disk, or the like. When the storage system has a plurality of hard disks 302, different hard disks 302 may be located on a same storage node, or may be located on a plurality of different storage nodes. This is not limited in implementation of this application. The controller 301 may be a CPU, an application-specific integrated circuit (ASIC), a field-programmable gate array (FPGA), or the like. The controller 301 may receive an external IO request, and write data into a storage medium of the hard disk 302 or read data from the storage medium of the hard disk 302 in response to the request.

Figure 3B:
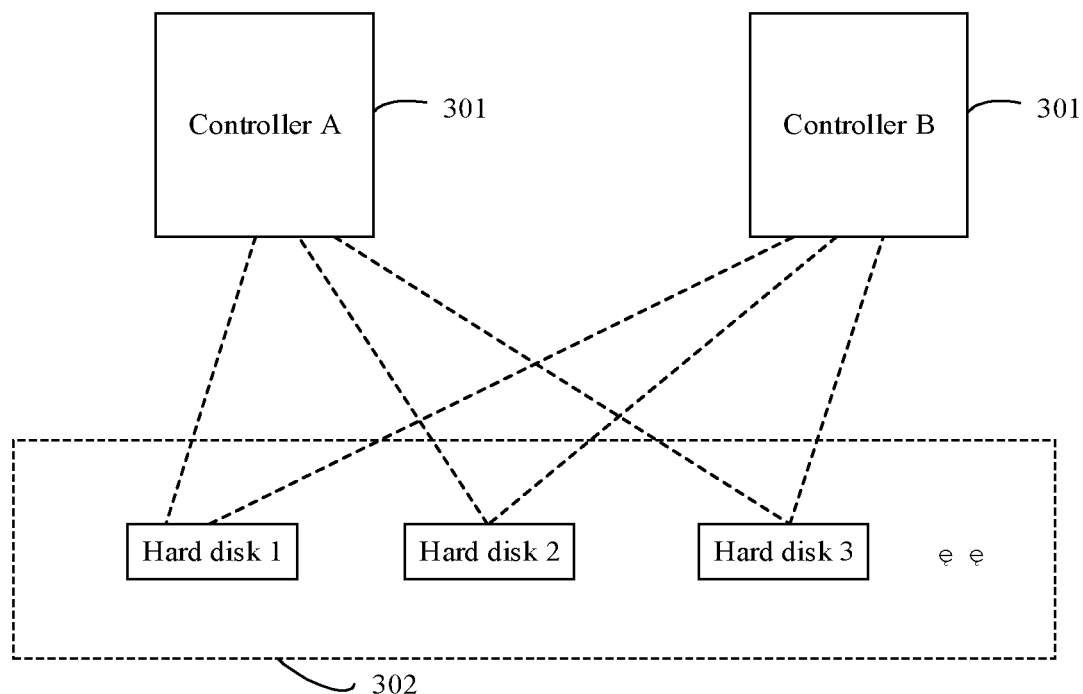
FIG. 3B is a schematic structural diagram of another storage system applicable to an embodiment of this application.

FIG. 3B shows another storage system applicable to an embodiment of this application. Different from an architecture shown in FIG. 3A, an architecture shown in FIG. 3B includes a plurality of controllers 301, for example, a controller A and a controller B. The controller A and the controller B may communicate with each other. In this way, when a controller 301 in the storage system is faulty, the storage system may still provide, by using another controller 301, a service for another device (such as a client) that interacts with the storage system.

Certainly, the storage system may further include another device, such as a host or a server. The storage system described in this embodiment of this application is intended to describe the technical solutions in the embodiments of this application more clearly, and does not constitute a limitation on the technical solutions provided in the embodiments of this application. It should be understood that, as a storage technology and a storage system architecture evolve, the technical solutions provided in the embodiments of this application are also applicable to a similar technical problem.

In the following, some terms of the embodiments of this application are described, to help persons skilled in the art have a better understanding.

(1) Data block: For a storage system, data may enter the system in a form of a data stream and be persistent. To organize, analyze, manage, and store data more efficiently, and improve data processing performance to the utmost extent by using a distributed technology, a parallel technology, and the like, the data stream entering the storage system may be split based on a preset rule, and one data stream is divided into a plurality of data blocks. The data stream may be divided in a fixed-length block segmentation manner or in a variable-length block segmentation manner. In the fixed-length block segmentation manner, a capacity of each data block is a preset capacity, in other words, data lengths of data blocks obtained through division are a same fixed length, and a data block obtained in the fixed-length block segmentation manner is referred to as a fixed-length data block. In the variable-length block segmentation manner, a capacity of a data block may have a plurality of capacities, in other words, data lengths of data blocks obtained through division may be different, and a data block obtained in the variable-length block segmentation manner is referred to as a variable-length data block. A data processing solution in the embodiments of this application may be applied to data processing of the fixed-length data block, or may be applied to data processing of the variable-length data block. This is not limited in the embodiments of this application. Generally, most storage systems store data in a form of a fixed-length data block. Therefore, in the following descriptions in this specification, the technical solutions in the embodiments of this application are mainly described in detail by using the fixed-length data block as an example.

(2) Compression: Compression means to effectively reduce repetition, redundancy, or the like in data information by using a special coding scheme, to reduce a data volume. Based on a compression effect, compression may be classified into two types: lossless compression and lossy compression. In a lossless compression manner, data can be reconstructed without distortion and accurately restored from compressed data. In a lossy compression manner, compressed data is distorted, original data cannot be completely accurately restored, and reconstructed data is merely an approximation of the original data. In the technical solutions in the embodiments of this application, lossless compression is mainly considered, to be specific, after being decompressed, a compressed data block can be restored to a data block that is not compressed.

(3) In the descriptions of this application, "a plurality of" means two or more, or "a plurality of" may be understood as "at least two". "At least one" may be understood as one or more, for example, understood as one, two, or more, including at least one, and means including one, two, or more, and a specific included one is not limited. For example, at least one of A, B, and C means that A, B, C, A and B, A and C, B and C, or A and B and C are included. The term "and/or" describes an association relationship for describing associated objects and represents that three relationships may exist. For example, A and/or B may represent the following three cases: only A exists, both A and B exist, and only B exists. In addition, the character "/" generally indicates an "or" relationship between the associated objects.

(4) Unless otherwise stated, in this application, an ordinal numeral such as "first" or "second" is used to distinguish between a plurality of objects, and is not used to limit a sequence, a time sequence, a priority, or a degree of importance of the plurality of objects.

In addition, the terms "include" and "have" in the embodiments and claims of this application and the accompanying drawings are not exclusive. For example, a process, a method, a system, a product, or a device including a series of steps or modules is not limited to the listed steps or modules, and may further include steps or modules that are not listed.

Figure 4:
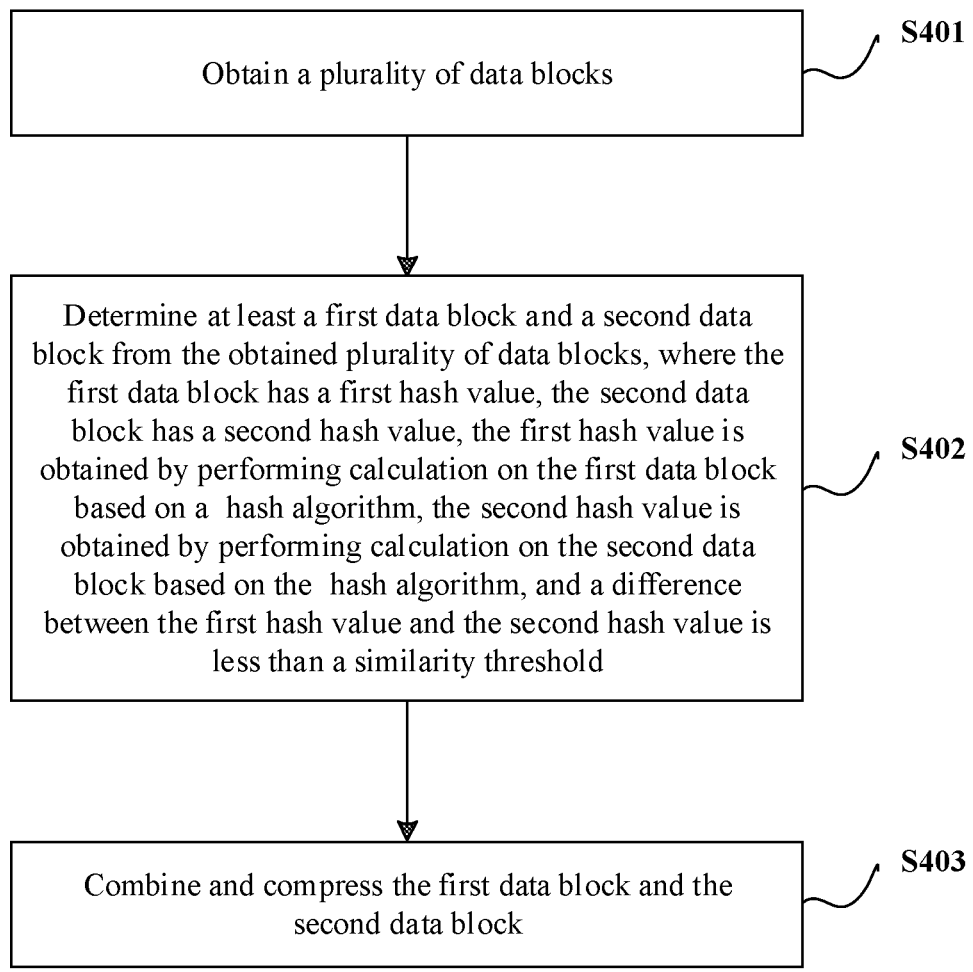
FIG. 4 is a flowchart of a possible data processing method according to an embodiment of this application.

FIG. 4 is a flowchart of a data processing method according to an embodiment of this application. In the following descriptions, for example, the method is applied to the storage system shown in FIG. 3A. In other words, the method may be performed by a controller in the storage system shown in FIG. 3A.

S401: The controller in the storage system obtains a plurality of data blocks.

Further, the controller in the storage system obtains address space of a latest batch of data blocks, where the latest batch of data blocks are data blocks that are not compressed, and reads the data blocks based on the address space. Each time after the controller reads a plurality of data blocks, the controller performs step S402 for the read plurality of data blocks, and performs next read after performing step S402 for the data blocks read this time.

In implementation of this application, a quantity of data blocks read by the controller each time may be the same, or may be different. This is not limited in this embodiment of this application.

S402: The controller in the storage system determines at least a first data block and a second data block from the obtained plurality of data blocks, where the first data block has a first hash value, the second data block has a second hash value, the first hash value is obtained by performing calculation on the first data block based on a hash algorithm, the second hash value is obtained by performing calculation on the second data block based on the hash algorithm, and a difference between the first hash value and the second hash value is less than a similarity threshold.

Further, after obtaining the plurality of data blocks, the controller in the storage system performs hash calculation on each of the plurality of data blocks by using the hash algorithm, to obtain a hash value corresponding to each data block, and then, determines whether there are at least two data blocks in the plurality of data blocks that meet the following condition. A difference between hash values corresponding to any two data blocks in the at least two data blocks is less than the preset similarity threshold, and if there are at least two such data blocks, step S403 is performed, or otherwise, step S401 continues to be performed.

In an optional implementation, in this embodiment of this application, a quantity of data blocks determined each time may be a preset value. In this embodiment of this application, a value of the preset value may be determined based on an application scenario setting requirement. For example, in a scenario in which a high data reduction ratio is required, the preset value may be set to a relatively large value, for example, set to 4, 5, or 7, and in a scenario in which low CPU overheads are required, the preset value may be set to a relatively small value, for example, set to 2 or 3. A specific value of the preset value is not limited in this embodiment of this application. In the following descriptions in this specification, for example, the preset value is 2, and the determined data blocks are respectively the first data block and the second data block, to describe the technical solutions in the embodiments of this application in detail.

In implementation of this application, the hash algorithm may have a plurality of implementations, provided that a hash algorithm meets a rule that corresponding data blocks are more similar when hash values are closer to each other. This is not limited in this embodiment of this application. A locality-sensitive hash (LSH) algorithm is used as an example of the hash algorithm below to describe a specific implementation of step S402 in detail.

(1) A locality-sensitive hash value (Min-hash) of each data block is calculated.

Figure 5:
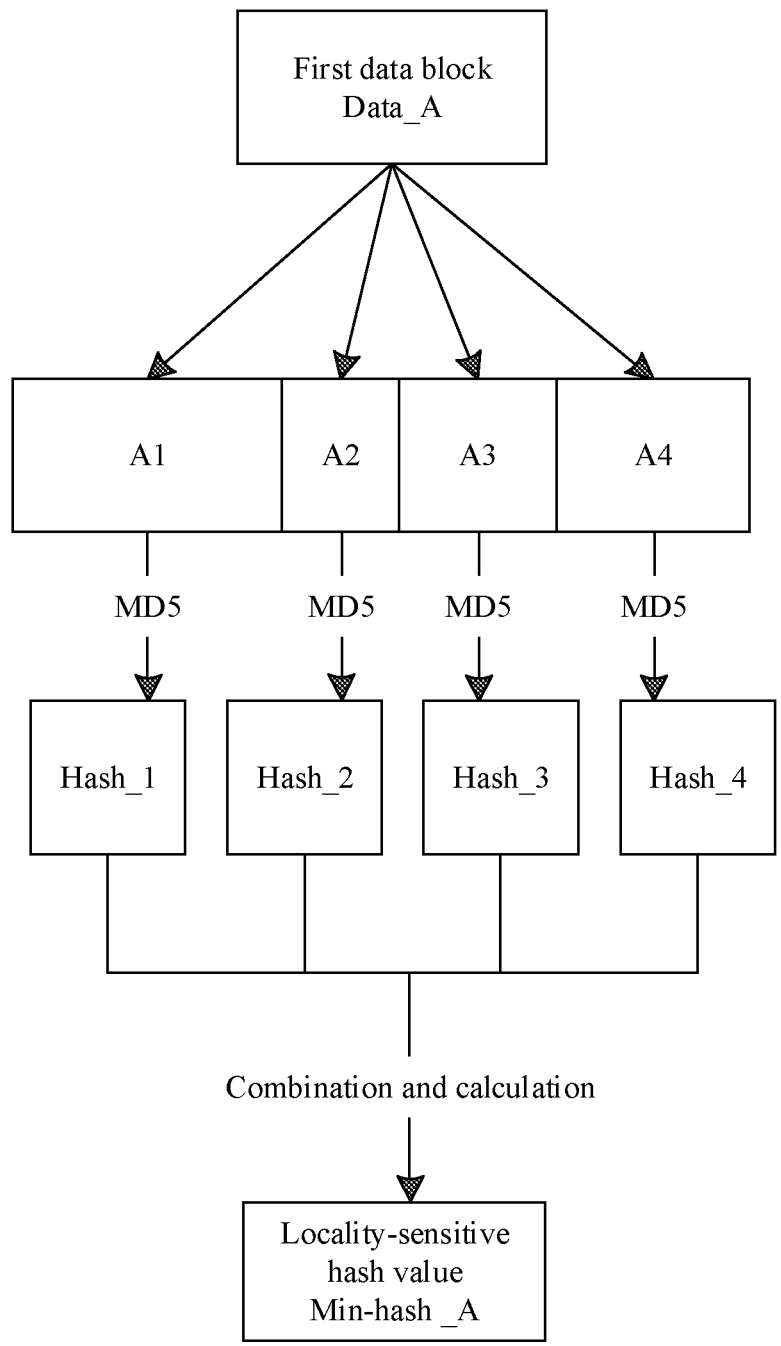
FIG. 5 is a schematic diagram of a calculation process of a locality-sensitive hash algorithm according to an embodiment of this application.

As shown in FIG. 5, a first data block Data_A is used as an example. First, the first data block Data_A is segmented into a plurality of data sub-blocks of different lengths, and a quantity of data sub-blocks obtained through segmentation may be any positive integer greater than or equal to 2. This is not limited in this embodiment of this application. For example, as shown in FIG. 5, the data block is segmented into four variable-length data sub-blocks a1, a2, a3, and a4. Then, a hash value of each of the plurality of data sub-blocks of different lengths is calculated. A hash algorithm used to calculate the hash value of each data sub-block herein may have a plurality of implementations, such as a message-digest (MD)5 algorithm and a Secure Hash Algorithm (SHA)1 algorithm. This is not limited in this embodiment of this application. For example, as shown in FIG. 5, it is learned through calculation by using the MD5 algorithm that hash values of four data sub-blocks A1, A2, A3, and A4 are respectively Hash_1, Hash_2, Hash_3, and Hash_4. Finally, hash values of the plurality of data sub-blocks of different lengths are combined and calculated to obtain a locality-sensitive hash value Min-hash_A corresponding to the first data block Data_A.

It should be understood that a process of calculating a locality-sensitive hash value of another data block is similar to a process of calculating the locality-sensitive hash value of the data block Data_A, and details are not described herein.

(2) A difference between locality-sensitive hash values corresponding to any two data blocks in the plurality of data blocks is calculated, and two data blocks whose locality-sensitive hash value difference is less than the preset similarity threshold are determined from the plurality of data blocks. The determined data blocks are the first data block and the second data block.

In implementation of this application, the difference between any two locality-sensitive hash values may be calculated in a plurality of implementations. For example, a Jaccard distance, a Euclidean distance, or a Hamming distance between different locality-sensitive hash values may be calculated for implementation. This is not limited in this embodiment of this application. When a difference calculation manner is the Jaccard distance, a Jaccard distance between hash values corresponding to the determined first data block and second data block is less than a first distance threshold. When the difference calculation manner is the Euclidean distance, a Euclidean distance between hash values corresponding to the determined first data block and second data block is less than a second distance threshold. When the difference calculation manner is the Hamming distance, a Hamming distance between hash values corresponding to the determined first data block and second data block is less than a third distance threshold.

The Jaccard distance is used as an example below for detailed description.

After the locality-sensitive hash value Min-hash_A of the first data block Data_A is obtained, the Min-hash_A is segmented into M feature vectors, and then, each feature vector is separately stored in a corresponding locality-sensitive hash tree (LSH tree), and M LSH trees form one locality-sensitive hash forest (LSH forest).

Figure 6:
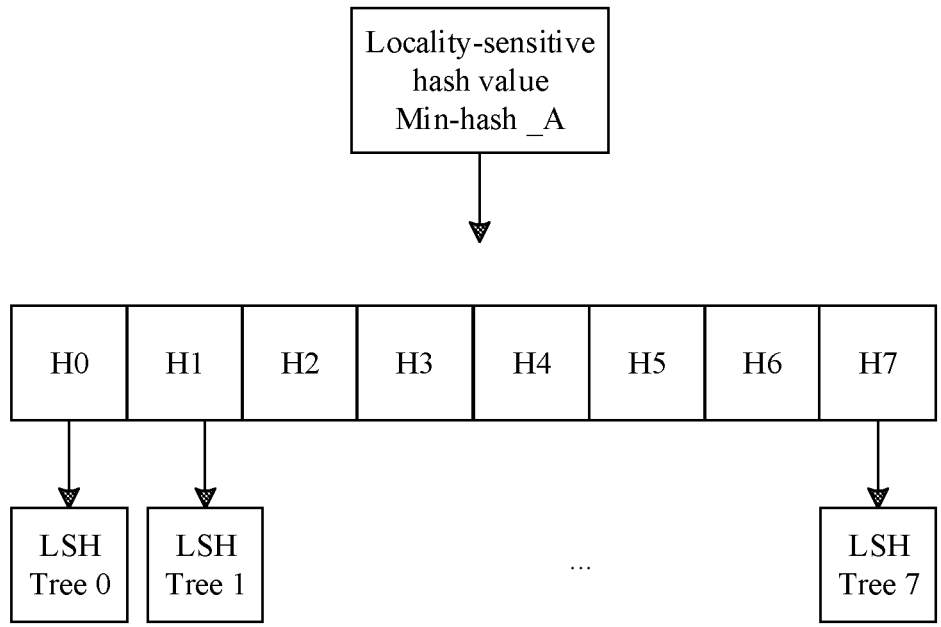
FIG. 6 is a schematic diagram of splitting a locality-sensitive hash value of a data block into a plurality of feature vectors according to an embodiment of this application.
Figure 7A:
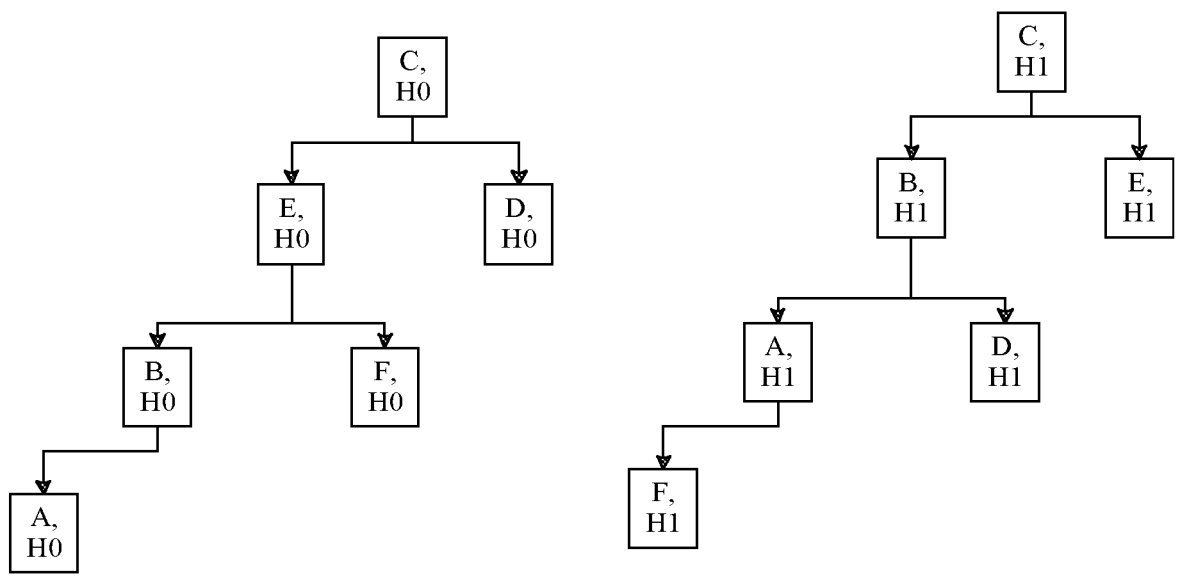
FIG. 7A, FIG. 7B, FIG. 7C, and FIG. 7D are schematic structural diagrams of a locality-sensitive hash forest according to an embodiment of this application.
Figure 7B:
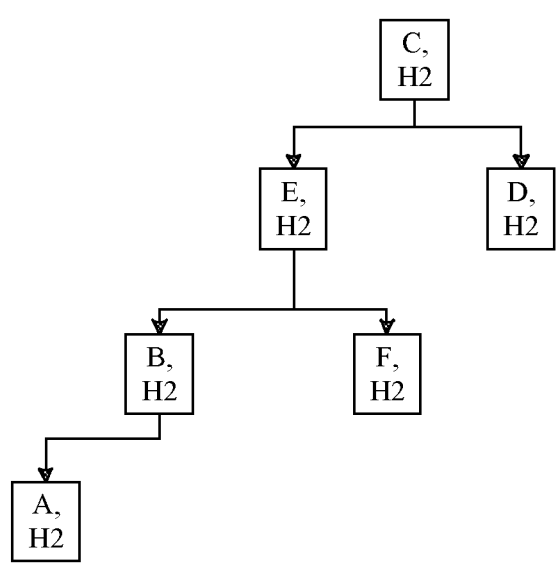
Figure 7B:
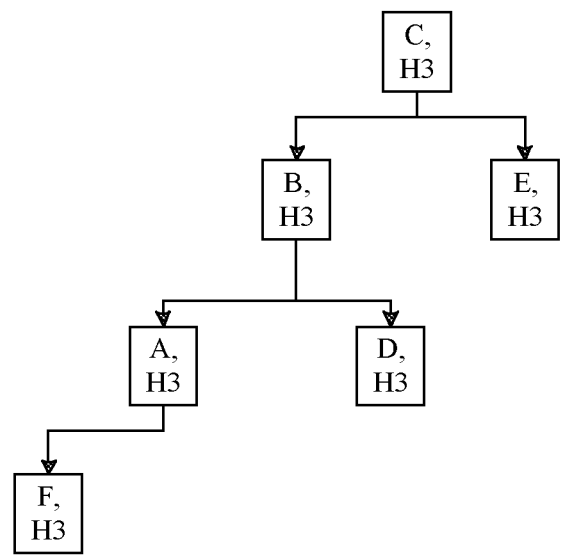
Figure 7C:
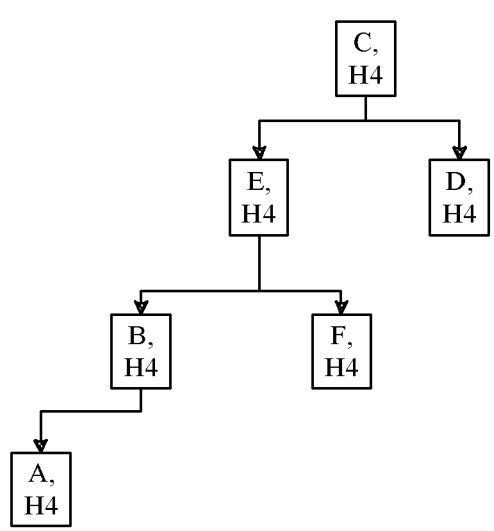
Figure 7C:
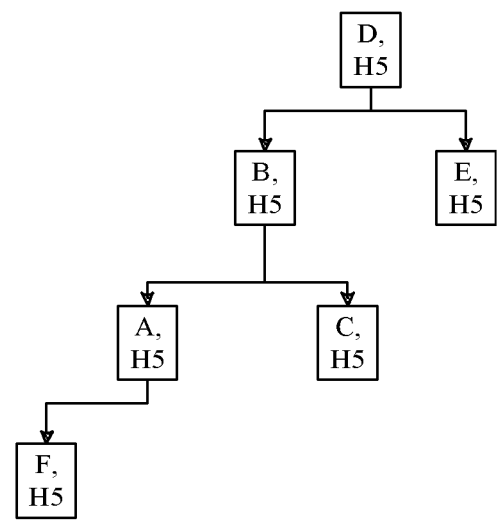
Figure 7D:
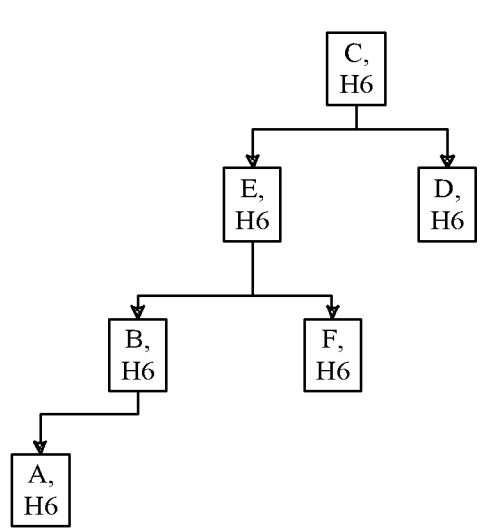
Figure 7D:
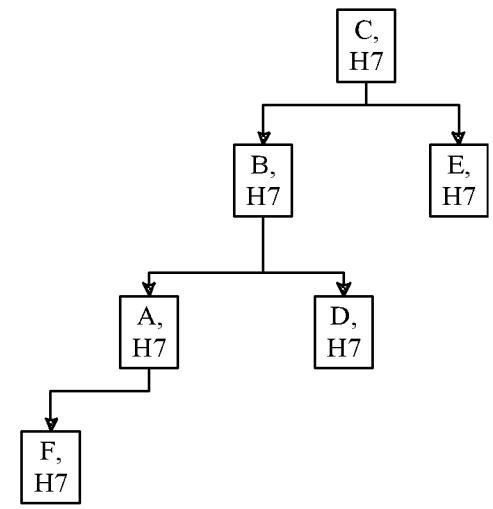

For example, M=8. As shown in FIG. 6, Min-hash_A is split into eight feature vectors: H0, H1, H2, H3, H4, H5, H6, and H7. H0 is stored in an LSH tree 0, H1 is stored in an LSH tree 1, H2 is stored in an LSH tree 2, H3 is stored in an LSH tree 3, H4 is stored in an LSH tree 4, H5 is stored in an LSH tree 5, H6 is stored in an LSH tree 6, and H7 is stored in an LSH tree 7. A locality-sensitive hash value of another data block is also processed in a same manner as the locality-sensitive hash value Min-hash_A, and details are not described herein.

FIG. 7A to FIG. 7D are schematic diagrams of the LSH tree 0 to the LSH tree 7. In an embodiment shown in FIG. 7A to FIG. 7D, eight global LSH trees form one LSH forest. All layers of each tree have a same vector dimension, values of first several bits of a feature vector on a subnode is the same as values of a feature vector on a parent node, and are different from a feature vector on a brother node only in terms of a last bit.

As shown in FIG. 7A to FIG. 7D, locality-sensitive hash values corresponding to a data block B, a data block C, a data block D, a data block E, and a data block F are stored in the LSH forest. After the locality-sensitive hash value Min-hash_A of the first data block Data_A is stored in the LSH forest, the LSH forest is searched for a nearest subnode, brother node, and parent node of a node (namely, (A, Hx), where x=0, 1, 2, ... , 7) on which each feature vector corresponding to Min-hash A is located. Based on a structure of the tree, feature vectors on these nodes are the most similar to the feature vector of Min-hash A. Then it is determined that in all nodes that are closest to the node on which each feature vector corresponding to Min-hash_A is located, a data block corresponding to a locality-sensitive hash value whose quantity of feature vector appearance times exceeds a predetermined quantity of times is the second data block.

For example, B that is closest to A is found in the LSH tree 0, and then B, F, and D that are closest to A are found in the LSH tree 1, until all LSH tree locations in the LSH forest are searched. In the embodiment shown in FIG. 7A to FIG. 7D, B appears eight times, D appears three times, F appears four times, and C appears once. It is assumed that the predetermined quantity of times is 5. In this case, only the data block B is satisfactory, and it is determined that the data block B is the second data block. In some possible embodiments, there may be a case in which a quantity of repetitions of a plurality of data blocks exceeds the predetermined quantity of times. For example, it is assumed that the predetermined quantity of times is 2, and in this case, the data blocks B, D, and F are satisfactory, and a data block, namely, the data block B, with a highest quantity of repetitions may be further determined from the data blocks B, D, and F, and the data block B is determined as the second data block.

S403: Combine and compress the first data block and the second data block.

Further, the controller in the storage system first combines the first data block and the second data block into one long data block, and then compresses the combined data block to obtain a compressed target data block. A compression algorithm used for the combined data block may have a plurality of implementations, such as Zstandard, Huffman coding, and arithmetic coding. This is not limited in this embodiment of this application.

In an optional implementation, in implementation of this application, before the controller in the storage system combines and compresses the first data block and the second data block, the method may further include determining that a data reduction ratio corresponding to the target data block obtained after the first data block and the second data block are combined and compressed reaches a reduction ratio threshold, for example, the reduction ratio reaches 50% (in other words, a data volume of the target data block is less than or equal to half of a total quantity of data blocks of the first data block and the second data block). If the data reduction ratio corresponding to the target data block cannot reach the reduction ratio threshold, combination and compression of the first data block and the second data block may be abandoned, and the first data block and the second data block are separately compressed by using a common compression algorithm. Generally, a higher similarity between data blocks leads to a higher data reduction ratio after combination and compression. However, in actual application, some accidental cases may cause a relatively low data reduction ratio after combination and compression. For example, if the first data block and the second data block that are used in compression are already compressed data blocks, the first data block and the second data block cannot be compressed again even if a similarity between the first data block and the second data block is very high. In this implementation, combination and compression are determined after the data reduction ratio is predetermined, so that it can be better ensured that a relatively high data reduction ratio can be obtained for all data blocks that are used in combination compression.

Further, after obtaining the combined and compressed target data block, the controller in the storage system may further write the target data block to a storage medium, and update metadata information (meta_info) corresponding to the first data block and the second data block.

During specific implementation, if a data length of the combined and compressed target data block exceeds a storage granularity (for example, a storage granularity 8 k of the storage system), the target data block may be split into several granularities based on a granularity unit, and a flag is added to an end of each segment of data, to identify consecutive data block address obtained after splitting. If the data length of the combined and compressed target data block is less than the storage granularity, 0 may be added to an end of the target data block.

In this embodiment of this application, the metadata information that needs to be updated may include a physical address (including a start physical address and a data offset), a combination compression identifier, a location identifier, and the like that are of the target data block.

For example, a first combination compression identifier may be added to the metadata information corresponding to the first data block, to indicate that a compression manner of the first data block is combination compression, and a second combination compression identifier may be added to the metadata information corresponding to the second data block, to indicate that a compression manner of the second data block is combination compression. Further, a first location identifier may be added to the metadata information corresponding to the first data block, to indicate a location of the first data block in the target data block, and a second location identifier is added to the metadata information corresponding to the second data block, to indicate a location of the second data block in the target data block.

Correspondingly, the updated metadata information corresponding to the first data block may include a metadata identity (ID) of the first data block, a physical address of the target data block, the first location identifier, and the first combination compression identifier, and the updated metadata information corresponding to the second data block may include a metadata ID of the second data block, the physical address of the target data block, the second location identifier, and the second combination compression identifier.

In a specific implementation process, the combination compression identifier or the location identifier may be indicated by a value of a predefined field in the metadata information. For example, a value of a first preset field on the corresponding metadata information of the first data block is set to "1", to indicate that the compression manner of the first data block is combination compression, and a value of a first preset field on the corresponding metadata information of the second data block is set to "1", to indicate that the compression manner of the second data block is combination compression. If there is a data block for which a combination compression manner is not used, a value of a first preset field on metadata information corresponding to the data block is "0". For example, a value of a second preset field on the metadata information corresponding to the first data block is set to "0", to indicate that the first data block is a first data block in the combined data block, and a value of a second preset field on the metadata information corresponding to the second data block is set to "1", to indicate that the second data block is a second data block in the combined data block. Certainly, during specific implementation, there may be another implementation for defining field lengths and values of the first preset field and the second preset field. This is not limited in this embodiment of this application.

In this embodiment of this application, the foregoing data processing procedure may be triggered by a timer, or triggered when a new data volume in storage space reaches a threshold. This is not limited in this embodiment of this application.

The foregoing describes a data compression process in the technical solutions of this application, and the following describes a corresponding data decompression embodiment.

(1) The controller in the storage system receives a read request initiated by the user, where the request includes a logical block address (LBA), such as an LBA 5, that is of the data block and that needs to be obtained by an application program.

(2) After receiving the read request, the controller in the storage system finds corresponding metadata information meta_info from a metadata tree (Meta_Info_TREE) based on the LBA 5 in the read request. The Meta Info TREE is a tree structure that maintains a logical address and a physical address, and each leaf node in the tree structure includes one piece of meta info.

Figure 8:
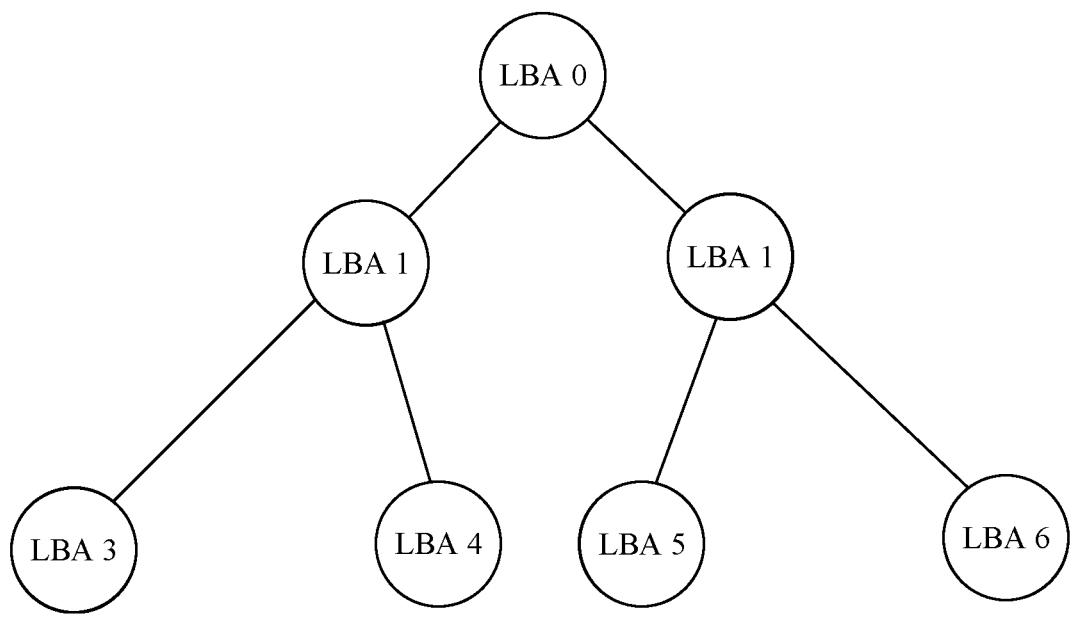
FIG. 8 is a schematic diagram of a storage structure of metadata information of a plurality of data blocks according to an embodiment of this application.
Figure 9:
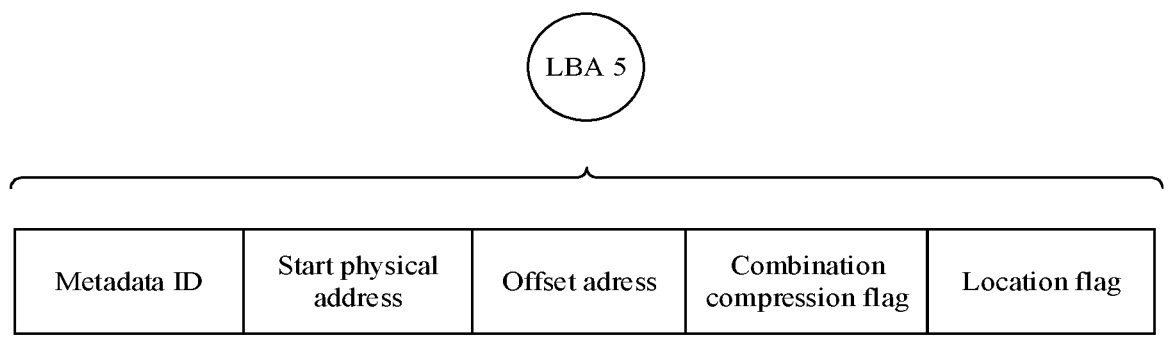
FIG. 9 is a schematic diagram of metadata information corresponding to one data block according to an embodiment of this application.

As shown in FIG. 8, each piece of meta_info corresponds to metadata information of one data block, and includes a metadata ID, a physical address (including a start physical address and an offset address), a combination compression flag, and a location flag that are of the data block, as shown in FIG. 9.

(3) The controller in the storage system determines, from the meta_info corresponding to the LBA 5, whether a value of a field in which a combination compression identifier of the data block is located is a value indicating that the compression manner is the combination compression manner (it is assumed that "1" indicates the combination compression manner), and if yes, performs step (4). Otherwise, it indicates that combination compression is not used, and another decompression procedure is performed, for example, a decompression procedure corresponding to separate compression.

(4) The controller in the storage system obtains a physical address from the meta_info corresponding to the LBA 5 (the physical address is a physical address of a combined and compressed data block on which the data block requested this time is located), and extracts a corresponding combined and compressed data block from the storage medium by using the physical address. A reading manner may be reading successively, and data of a size such as 8 k is read each time.

(5) The controller in the storage system decompresses the read combined and compressed data block by using a decompression method corresponding to combination compression, obtains a location identifier from the meta_info corresponding to the LBA 5, and determines, based on the obtained location identifier, a location of the requested data block in the combined and compressed data block (for example, is a first combined and compressed data block), to read the data block, and return the data block in response to the read request of the user.

In the technical solutions of the embodiments of this application, after obtaining the plurality of data blocks that need to be compressed, the storage system first calculates the hash value of each data block by using the hash algorithm, and then indirectly evaluates a similarity between the data blocks by comparing differences between hash values of the data blocks (a smaller difference indicates a higher similarity), and then determines, from the data blocks, data blocks that meet a similarity condition and combines and compresses the data blocks. Therefore, a relatively good data reduction ratio can be obtained for all combined and compressed data blocks, and a common compression manner is used for another data block, to reduce system compression and decompression overheads as much as possible. In the technical solutions of the embodiments of this application, the storage system may automatically and flexibly adjust, based on the similarity between the data blocks, a quantity of combined and compressed data blocks, so that a balance between a data reduction ratio of the storage system and system overheads can be better achieved.

In addition, in the technical solutions of the embodiments of this application, a locality-sensitive hash algorithm is used to perform calculation on each data block, and a dataset is searched by using the data structure of the LSH forest for the data blocks that meet the similarity condition, so that efficiency of searching for similar data blocks can be improved. During calculation of the locality-sensitive hash value, the data block is segmented into a finer granularity by using a variable-length block segmentation technology, to obtain the plurality of data sub-blocks of different lengths, to resolve a problem that data cannot be deduplicated due to boundary movement of the data block.

Figure 10:
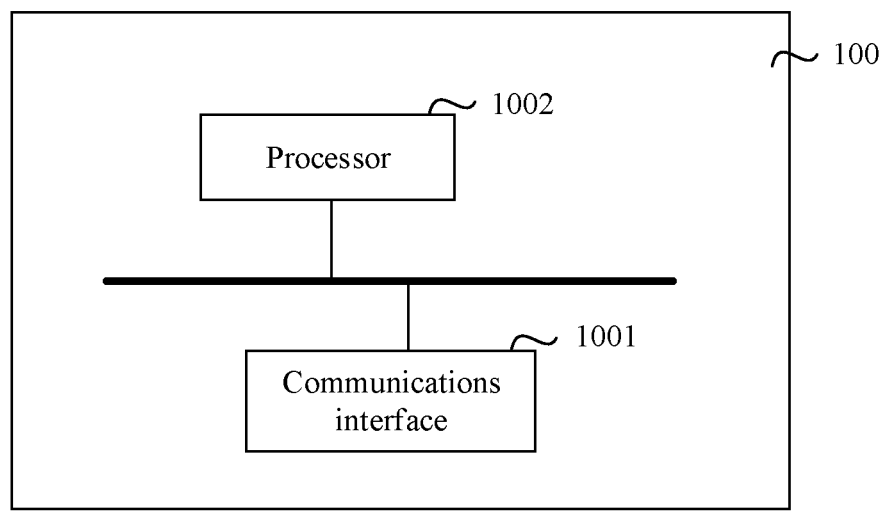
FIG. 10 is a schematic structural diagram of a possible data processing apparatus according to an embodiment of this application.

As shown in FIG. 10, based on a same technical concept, an embodiment of this application further provides a data processing apparatus 100, including a communications interface 1001 and a processor 1002. The processor 1002 is configured to obtain a plurality of data blocks by using the communications interface 1001, determine at least a first data block and a second data block from the plurality of data blocks, where the first data block has a first hash value, the second data block has a second hash value, the first hash value is obtained by performing calculation on the first data block based on a hash algorithm, the second hash value is obtained by performing calculation on the second data block based on the hash algorithm, and a difference between the first hash value and the second hash value is less than a similarity threshold, and combine and compress the first data block and the second data block. This embodiment provides the data processing apparatus 100 that is configured to compress data, to obtain a relatively good data reduction ratio for all combined and compressed data blocks, and to achieve a better balance between a data reduction ratio of a storage system and system overheads.

To improve solution flexibility, in this embodiment of this application, the hash algorithm may have a plurality of implementations provided that a hash algorithm meets a rule that corresponding data blocks are more similar when hash values are closer to each other. For example, in a possible implementation, the hash algorithm may be a locality-sensitive hash algorithm.

Further, when performing calculation on the first data block based on the locality-sensitive hash algorithm, the processor 1002 may segment the first data block into a plurality of data sub-blocks of different lengths, calculate a hash value of each of the plurality of data sub-blocks of different lengths, combine and calculate hash values of the plurality of data sub-blocks of different lengths to obtain a locality-sensitive hash value corresponding to the first data block, and use the locality-sensitive hash value as the first hash value.

To improve solution flexibility, in this embodiment of this application, the processor 1002 may calculate a difference between any two locality-sensitive hash values in a plurality of implementations. For example, a Jaccard distance, a Euclidean distance, a Hamming distance, or the like of different locality-sensitive hash values is calculated. This is not limited in this embodiment of this application.

In this embodiment of this application, when different difference calculation manners are used, corresponding similarity thresholds may be different.

For example, when the processor 1002 calculates the difference between any two locality-sensitive hash values by using the Jaccard distance, a Jaccard distance between the first hash value and the second hash value is less than a first distance threshold.

For another example, when the processor 1002 calculates the difference between any two locality-sensitive hash values by using the Euclidean distance, a Euclidean distance between the first hash value and the second hash value is less than a second distance threshold.

For still another example, when the processor 1002 calculates the difference between any two locality-sensitive hash values by using the Hamming distance, a Hamming distance between the first hash value and the second hash value is less than a third distance threshold.

In this embodiment of this application, when combining and compressing the first data block and the second data block, the processor 1002 may combine the first data block and the second data block, and compress a combined data block to obtain a target data block.

Further, after combining and compressing the first data block and the second data block, the processor 1002 may further add a first combination compression identifier to metadata information corresponding to the first data block, to indicate that a compression manner of the first data block is combination compression, and may further add a second combination compression identifier to metadata information corresponding to the second data block, to indicate that a compression manner of the second data block is combination compression.

Further, after combining and compressing the first data block and the second data block, the processor 1002 may further add a first location identifier to the metadata information corresponding to the first data block, to indicate a location of the first data block in the target data block, and may further add a second location identifier to the metadata information corresponding to the second data block, to indicate a location of the second data block in the target data block.

In addition, before combining and compressing the first data block and the second data block, the processor 1002 may further determine that a data reduction ratio corresponding to the target data block obtained after the first data block and the second data block are combined and compressed reaches a reduction ratio threshold. In other words, the processor 1002 combines and compresses the first data block and the second data block only when determining that the data reduction ratio corresponding to the target data block reaches the reduction ratio threshold. This can better ensure that a relatively high data reduction ratio can be obtained for all data blocks that are used in combination compression.

Figure 11:
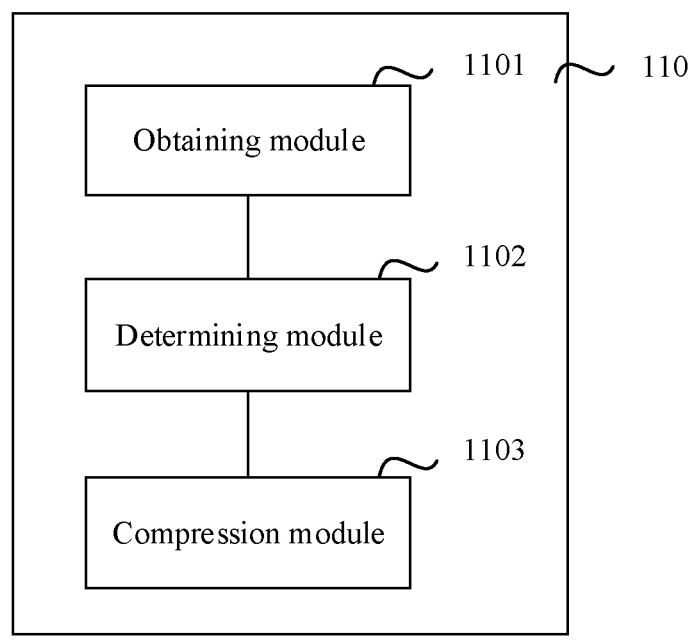
FIG. 11 is a schematic structural diagram of another possible data processing apparatus according to an embodiment of this application.

Refer to FIG. 11. Based on a same technical concept, an embodiment of this application further provides a data processing apparatus 110, including an obtaining module 1101 configured to obtain a plurality of data blocks through a communications interface, a determining module 1102 configured to determine at least a first data block and a second data block from the plurality of data blocks, where the first data block has a first hash value, and the second data block has a second hash value, the first hash value is obtained by the determining module 1102 by performing calculation on the first data block based on a hash algorithm, the second hash value is obtained by the determining module 1102 by performing calculation on the second data block based on the hash algorithm, and a difference between the first hash value and the second hash value is less than a similarity threshold, and a compression module 1103 configured to combine and compress the first data block and the second data block.

This embodiment provides the data processing apparatus 110 that is configured to compress data, to obtain a relatively good data reduction ratio for all combined and compressed data blocks, and to achieve a better balance between a data reduction ratio of a storage system and system overheads.

To improve solution flexibility, in this embodiment of this application, a hash algorithm may have a plurality of implementations provided that a hash algorithm meets a rule that corresponding data blocks are more similar when hash values are closer to each other. For example, in a possible implementation, the hash algorithm may be a locality-sensitive hash algorithm.

When the determining module 1102 performs calculation on the first data block based on the locality-sensitive hash algorithm, a specific process may be as follows. The determining module 1102 first segments the first data block into a plurality of data sub-blocks of different lengths, and then calculates a hash value of each of the plurality of data sub-blocks of different lengths, and finally, combines and calculates hash values of the plurality of data sub-blocks of different lengths, to obtain a locality-sensitive hash value corresponding to the first data block, and uses the locality-sensitive hash value as the first hash value.

To improve solution flexibility, in this embodiment of this application, the determining module 1102 may calculate a difference between any two locality-sensitive hash values in a plurality of implementations. For example, a Jaccard distance, a Euclidean distance, a Hamming distance, or the like of different locality-sensitive hash values is calculated. This is not limited in this embodiment of this application.

In this embodiment of this application, similarity thresholds corresponding to different difference calculation manners may be different.

For example, when the determining module 1102 calculates the difference between any two locality-sensitive hash values by using the Jaccard distance, a Jaccard distance between the first hash value and the second hash value is less than a first distance threshold.

For another example, when the determining module 1102 calculates the difference between any two locality-sensitive hash values by using the Euclidean distance, a Euclidean distance between the first hash value and the second hash value is less than a second distance threshold.

For still another example, when the determining module 1102 calculates the difference between any two locality-sensitive hash values by using the Hamming distance, a Hamming distance between the first hash value and the second hash value is less than a third distance threshold.

In this embodiment of this application, when combining and compressing the first data block and the second data block, the compression module 1103 may combine the first data block and the second data block, and compress the combined data block to obtain a target data block.

Further, after combining and compressing the first data block and the second data block, the compression module 1103 may further add a first combination compression identifier to metadata information corresponding to the first data block, to indicate that a compression manner of the first data block is combination compression, and add a second combination compression identifier to metadata information corresponding to the second data block, to indicate that a compression manner of the second data block is combination compression.

Further, after combining and compressing the first data block and the second data block, the compression module 1103 may further add a first location identifier to the metadata information corresponding to the first data block, to indicate a location of the first data block in the target data block, and add a second location identifier to the metadata information corresponding to the second data block, to indicate a location of the second data block in the target data block.

In addition, before combining and compressing the first data block and the second data block, the compression module 1103 may further determine that a data reduction ratio corresponding to the target data block obtained after the first data block and the second data block are combined and compressed reaches a reduction ratio threshold. In other words, the compression module 1103 combines and compresses the first data block and the second data block only when determining that the data reduction ratio corresponding to the target data block reaches the reduction ratio threshold. This can better ensure that a relatively high data reduction ratio can be obtained for all data blocks that are used in combination compression.

It should be understood that functions of the foregoing obtaining module 1101, the determining module 1102, and the compression module 1103 may be separately executed by a processor, or may be executed by the processor by invoking a program instruction in a memory. This is not limited in this embodiment of this application. For example, when the processor is a CPU, the CPU invokes a program instruction in the memory to execute functions of the foregoing modules. For example, when the processor is an FPGA, the FPGA independently executes functions of the foregoing modules.

Because the method and the apparatus in the present disclosure are based on a same concept, all related content of steps in the foregoing method embodiments may be cited in function descriptions of corresponding functional modules. Details are not described herein again.

Based on a same technical concept, an embodiment of this application provides a computer-readable storage medium, and a computer program is stored on the computer-readable storage medium. When the program is executed by a processor, the data processing method described in the embodiments of this application is implemented.

Based on a same technical concept, an embodiment of this application further provides a computer program product. When the program product is executed by a computer, the computer is enabled to implement the data processing method in the embodiments of this application.

Based on a same technical concept, an embodiment of this application further provides a chip. The chip may be coupled to a memory, and the chip and the memory may be physically disposed independently. Alternatively, the chip may include the memory, and the chip may invoke and execute a computer program stored in the memory, to execute the data processing method described in the embodiments of this application.

The embodiments of this application are described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DIGITAL VERSATILE DISC (DVD)), a semiconductor medium (for example, an SSD), or the like.

What is claimed is:

1. A data processing method comprising:
    obtaining a plurality of data blocks;
    determining a first data block and a second data block from the data blocks, wherein the first data block has a first hash value that is based on a first calculation on the first data block using a hash algorithm, and wherein the second data block has a second hash value that is based on a second calculation on the second data block using the hash algorithm;
    determining that the first data block and the second data block meet a similarity condition based on a degree of similarity of the first hash value and the second hash value;
    determining whether a data reduction ratio corresponding to a target data block to be obtained by combining and compressing the first data block and the second data block reaches a reduction ratio threshold;
    when determining that the data reduction ratio reaches the reduction ratio threshold, combining and compressing the first data block and the second data block using a first compression algorithm; and
    when determining that the data reduction ratio does not reach the reduction ratio threshold, separately compressing the first data block and the second data block using a second compression algorithm different from the first compression algorithm.

2. The data processing method of claim 1, wherein the hash algorithm is a locality-sensitive hash algorithm.

3. The data processing method of claim 2, further comprising:
    segmenting the first data block into a plurality of data sub-blocks of different lengths;
    calculating a hash value of each of the data sub-blocks;
    performing combination calculation on hash values of the data sub-blocks to obtain a locality-sensitive hash value corresponding to the first data block; and
    setting the locality-sensitive hash value as the first hash value.

4. The data processing method of claim 3, further comprising:
    identifying that a difference between the first hash value and the second hash value is less than a similarity threshold; and
    obtaining the degree of similarity based on the identifying.

5. The data processing method of claim 4, further comprising identifying that a Jaccard distance between the first hash value and the second hash value is less than a first distance threshold.

6. The data processing method of claim 4, further comprising identifying that a Euclidean distance between the first hash value and the second hash value is less than a second distance threshold.

7. The data processing method of claim 4, further comprising identifying that a Hamming distance between the first hash value and the second hash value is less than a third distance threshold.

8. The data processing method of claim 1, after combining and compressing the first data block and the second data block, the method further comprising:
    adding a first combination compression identifier to first metadata information corresponding to the first data block to indicate that a first compression manner of the first data block is combination compression; and
    adding a second combination compression identifier to second metadata information corresponding to the second data block to indicate that a second compression manner of the second data block is the combination compression.

9. The data processing method of claim 8, wherein after combining and compressing the first data block and the second data block, the data processing method further comprises:
    adding a first location identifier to the first metadata information to indicate a first location of the first data block in the target data block; and
    adding a second location identifier to the second metadata information to indicate a second location of the second data block in the target data block.

10. The data processing method of claim 1, after combining and compressing the first data block and the second data block, the method further comprising:
    determining whether a data length of a combined and compressed target data block exceeds a storage granularity;
    when determining that the data length of the combined and compressed target data block exceeds the storage granularity, splitting the combined and compressed target data block into several granularities based on a granularity unit and adding a flag to an end of each segment of data to identify consecutive data block address; and
    when determining that the data length of the combined and compressed target data block is less than the storage granularity, adding 0 to an end of the combined and compressed target data block.

11. A data processing apparatus comprising:
    a communications interface; and a processor coupled to the communications interface and configured to execute instructions stored in a memory to cause the data processing apparatus to:

obtain a plurality of data blocks;

determine a first data block and a second data block from the data blocks, wherein the first data block has a first hash value that is based on a first calculation on the first data block based on a hash algorithm, and wherein the second data block has a second hash value that is based on a second calculation on the second data block based on the hash algorithm;

determine that the first data block and the second data block meet a similarity condition based on a degree of similarity of the first hash value and the second hash value;

determine whether a data reduction ratio corresponding to a target data block to be obtained by combining and compressing the first data block and the second data block reaches a reduction ratio threshold;

when determining that the data reduction ratio reaches the reduction ratio threshold, combine and compress the first data block and the second data block using a first compression algorithm; and when determining that the data reduction ratio does not reach the reduction ratio threshold, separately compress the first data block and the second data block using a second compression algorithm different from the first compression algorithm.

12. The data processing apparatus of claim 11, wherein the hash algorithm is a locality-sensitive hash algorithm.

13. The data processing apparatus of claim 12, wherein the processor further causes the data processing apparatus to:

segment the first data block into a plurality of data sub-blocks of different lengths;

calculate a hash value of each of the data sub-blocks;

perform combination calculation on hash values of the data sub-blocks to obtain a locality-sensitive hash value corresponding to the first data block; and set the locality-sensitive hash value as the first hash value.

14. The data processing apparatus of claim 13, wherein the processor further causes the data processing apparatus to:

identify that a Jaccard distance between the first hash value and the second hash value is less than a first distance threshold;

identify that a Euclidean distance between the first hash value and the second hash value is less than a second distance threshold; or identify that a Hamming distance between the first hash value and the second hash value is less than a third distance threshold.

15. The data processing apparatus of claim 11, wherein the processor further causes the data processing apparatus to:

identify that a difference between the first hash value and the second hash value is less than a similarity threshold; and obtain the degree of similarity based on the difference between the first hash value and the second hash value.

16. The data processing apparatus of claim 11, wherein after combining and compressing the first data block and the second data block, the processor further causes the data processing apparatus to:

add a first combination compression identifier to first metadata information corresponding to the first data block to indicate that a first compression manner of the first data block is combination compression; and add a second combination compression identifier to second metadata information corresponding to the second data block to indicate that a second compression manner of the second data block is the combination compression.

17. The data processing apparatus of claim 16, wherein after combining and compressing the first data block and the second data block, the processor further causes the data processing apparatus to:

add a first location identifier to the first metadata information to indicate a first location of the first data block in the target data block; and add a second location identifier to the second metadata information to indicate a second location of the second data block in the target data block.

18. The data processing apparatus of claim 11, wherein after combining and compressing the first data block and the second data block, the processor is further configured to execute the instructions to cause the data processing apparatus to:

determine whether a data length of a combined and compressed target data block exceeds a storage granularity;

when determining that the data length of the combined and compressed target data block exceeds the storage granularity, split the combined and compressed target data block into several granularities based on a granularity unit and add a flag to an end of each segment of data to identify consecutive data block address; and when determining that the data length of the combined and compressed target data block is less than the storage granularity, add 0 to an end of the combined and compressed target data block.

19. A non-transitory computer-readable medium storing a computer program for a storage system, the computer program comprising instructions executable to:

obtain a plurality of data blocks;

determine a first data block and a second data block from the data blocks, wherein the first data block has a first hash value that is based on a first calculation on the first data block based on a hash algorithm, and wherein the second data block has a second hash value that is based on a second calculation on the second data block based on the hash algorithm;

determine that the first data block and the second data block meet a similarity condition based on a degree of similarity of the first hash value and the second hash value;

determine whether a data reduction ratio corresponding to a target data block to be obtained by combining and compressing the first data block and the second data block reaches a reduction ratio threshold;

when determining that the data reduction ratio reaches the reduction ratio threshold, combine and compress the first data block and the second data block using a first compression algorithm; and when determining that the data reduction ratio does not reach the reduction ratio threshold, separately compress the first data block and the second data block using a second compression algorithm different from the first compression algorithm.

20. The non-transitory computer-readable medium of claim 19, the computer program further comprising instructions executable to:

after combining and compressing the first data block and the second data block, determine whether a data length of a combined and compressed target data block exceeds a storage granularity;

when determining that the data length of the combined and compressed target data block exceeds the storage granularity, split the combined and compressed target data block into several granularities based on a granularity unit and add a flag to an end of each segment of data to identify consecutive data block address; and when determining that the data length of the combined and compressed target data block is less than the storage granularity, add 0 to an end of the combined and compressed target data block.

\* \* \* \* \*